United States Patent
Kim et al.

(10) Patent No.: US 10,655,985 B2
(45) Date of Patent: May 19, 2020

(54) METHOD FOR DETECTING ANGLE OF ROTATION USING AUTOMATIC GAIN ADJUSTMENT ALGORITHM AND APPARATUS THEREOF

(71) Applicant: Haechitech Corporation, Cheongju-si (KR)

(72) Inventors: Dong Yoon Kim, Ithaca, NY (US); Seong Min Choe, Seongnam-si (KR); Eun Joong Kim, Namyangju-si (KR); Joon Yul Yun, Seoul (KR)

(73) Assignee: Haechitech Corporation, Cheongju-si (KR)

( * ) Notice: Subject to any disclaimer, the term of this patent is extended or adjusted under 35 U.S.C. 154(b) by 63 days.

(21) Appl. No.: 16/204,629

(22) Filed: Nov. 29, 2018

(65) Prior Publication Data
US 2019/0195656 A1 Jun. 27, 2019

(30) Foreign Application Priority Data
Dec. 27, 2017 (KR) .......... 10-2017-0181607

(51) Int. Cl.
*G01B 7/14* (2006.01)
*G01B 7/30* (2006.01)
(Continued)

(52) U.S. Cl.
CPC .......... *G01D 5/145* (2013.01); *G01D 5/12* (2013.01); *G01D 5/142* (2013.01); *G01D 11/245* (2013.01);
(Continued)

(58) Field of Classification Search
CPC ...... G01D 5/145; G01D 5/142; G01D 11/245; G01D 5/12; G01R 33/07; G01R 33/077; G01R 33/072; G01R 33/09
See application file for complete search history.

(56) References Cited

U.S. PATENT DOCUMENTS

| | | | | |
|---|---|---|---|---|
| 2005/0275399 A1* | 12/2005 | Kitanaka | .......... | G01D 5/145 324/207.12 |
| 2014/0225596 A1* | 8/2014 | Nakamura | .......... | G01R 33/07 324/207.2 |
| 2018/0149495 A1* | 5/2018 | Lee | .......... | G01D 5/145 |

FOREIGN PATENT DOCUMENTS

| | | |
|---|---|---|
| JP | 2005-43228 A | 2/2005 |
| KR | 10-2010-0126273 A | 12/2010 |

OTHER PUBLICATIONS

Korean Office Action dated Nov. 19, 2018 in counterpart Korean Patent Application No. 10-2017-0181607 (5 pages, in Korean).

* cited by examiner

*Primary Examiner* — Raul J Rios Russo
(74) *Attorney, Agent, or Firm* — NSIP Law

(57) ABSTRACT

A rotation angle detecting method includes detecting a first rotation angle based on a first measured magnetic value received from a first hall element, detecting a first magnetic value received from a second hall element corresponding to the first detected rotation angle, adjusting a gain based on a first difference value between a second measured magnetic value received from the second hall element, in response to one of the magnetic pieces being rotated at the first rotation angle, and the first magnetic value, redetecting a second rotation angle by applying the gain to the first magnetic value and redetecting a second magnetic value received from the second hall element, corresponding to the second rotation angle, and outputting the second rotation angle as a confirmed rotation angle in response to a second difference value between the second magnetic value and the second measured magnetic value becoming less than a delta value.

16 Claims, 14 Drawing Sheets

(51) Int. Cl.
   *G01R 33/06*    (2006.01)
   *H01L 43/06*    (2006.01)
   *G01D 5/14*     (2006.01)
   *G01D 11/24*    (2006.01)
   *G01D 5/12*     (2006.01)
   *G01R 33/07*        (2006.01)
   *G01R 33/09*        (2006.01)
(52) U.S. Cl.
   CPC ............ *G01R 33/07* (2013.01); *G01R 33/072* (2013.01); *G01R 33/077* (2013.01); *G01R 33/09* (2013.01)

FIG. 11

| x(deg) | Z1 | Z3 | Z4 |
|---|---|---|---|
| 0 | -0.9582 | -1.2423 | 16.3109 |
| 1 | -9.9223 | 3.7301 | 14.7059 |
| 2 | -23.5726 | 8.8356 | 12.2405 |
| 3 | -43.1447 | 11.0684 | 7.5711 |
| 4 | -69.9049 | 9.8537 | -0.6776 |
| 5 | -105.2316 | 5.5378 | -13.6173 |
| 6 | -150.6071 | -1.8969 | -32.0672 |
| 7 | -207.0544 | -13.2665 | -56.7996 |
| 8 | -273.9164 | -29.9085 | -88.7829 |
| 9 | -347.4691 | -53.2795 | -129.0538 |
| 10 | -420.2681 | -84.8707 | -178.0308 |
| 11 | -481.9944 | -126.3280 | -234.4594 |
| 12 | -521.8938 | -179.2260 | -294.5247 |
| 13 | -532.0206 | -244.0456 | -351.7479 |
| 14 | -509.9395 | -318.5430 | -398.0162 |
| 15 | -459.6520 | -396.4241 | -425.5664 |
| 16 | -390.2968 | -467.4582 | -429.2451 |
| 17 | -313.2028 | -519.5950 | -408.1440 |
| 18 | -238.5978 | -542.5465 | -365.9236 |
| 19 | -173.3124 | -531.3366 | -309.6801 |
| 20 | -120.1877 | -488.1351 | -247.8316 |
| 21 | -78.9908 | -421.4702 | -187.8847 |
| 22 | -47.9889 | -343.2139 | -134.9101 |
| 23 | -25.2517 | -264.8058 | -91.1549 |
| 24 | -9.2047 | -194.4012 | -56.6605 |
| 25 | 1.4278 | -135.9246 | -30.3466 |
| 26 | 7.7936 | -89.8893 | -10.9392 |
| 27 | 10.8100 | -54.9974 | 2.6261 |
| 28 | 10.8322 | -29.4531 | 11.3028 |
| 29 | 7.5323 | -11.4922 | 16.2123 |
| 30 | 0.4345 | 0.6272 | 18.7512 |

METHOD FOR DETECTING ANGLE OF ROTATION USING AUTOMATIC GAIN ADJUSTMENT ALGORITHM AND APPARATUS THEREOF

CROSS-REFERENCE TO RELATED APPLICATIONS

This application claims the benefit under 35 USC 119(a) of Korean Patent Application No. 10-2017-0181607 filed on Dec. 27, 2017 in the Korean Intellectual Property Office, the entire disclosure of which is incorporated herein by reference for all purposes.

BACKGROUND

1. Field

The following description relates to an apparatus for detecting a rotation angle of a rotary body. The following description also relates to a method for detecting a rotation angle of a rotary body.

2. Description of Related Art

For a rotation angle detecting apparatus, there is known a structure in which a permanent magnet is attached to a rotating plate and at least one hall sensor is disposed nearby. The apparatus may calculate a relative rotation angle of a magnet with respect to a sensor by detecting changes in a magnetic field based on detecting a relative motion between a magnet and a sensor. Using such a principle, it is possible to reliably convert a measured value into a distance or an angle when characteristics of a magnet and a sensor are uniform.

FIG. 16 shows graphs for explaining an alternative art related to providing a rotation angle detecting apparatus.

Referring to FIG. 16 at (a), magnetic values in the graph are measured by rotating a rotating plate clockwise and counterclockwise. The shape of such a signal is left-right symmetric with respect to a time point at which the rotation direction of the rotating plate changes, and a peak of the signal appears at the bottom whenever magnetic pieces cross by a hall sensor. Referring to an enlarged portion of FIG. 16 at (a), magnetic values from each of the hall sensors are measured as shown in FIG. 16 at (b). The deviation of the peak value in FIG. 16 at (a) is due to the unevenness of each magnet piece. It can be seen that the peak in the negative direction is from a minimum value of −600 counts to a maximum value of −500 counts. Thus, even a product that may be regarded as the same magnet piece shows a deviation of 20%.

FIG. 17 is a graph for explaining an alternative art related to a rotation angle detecting apparatus. FIG. 17 is based on taking an example by setting a portion from the middle point of one magnet piece located on a rotating plate to the middle point of the next magnet piece as one section and by superimposing, out of the curves in FIG. 16, a curve having the maximum peak value and a curve having the minimum peak value in such a predetermined section.

Referring to the example of FIG. 17, an ideal curve desired to be measured at any one hall sensor, such as hall sensor $Z_3$ of a plurality of hall sensors is a curve $Z_3$ represented by a thick dotted line. Curve $Z'_3$ shows the maximum peak, and curve $Z''_3$ shows the minimum peak. Let the magnetic value for angle x be −300 counts in the curve $Z_3$. In this example, an angle corresponding to −300 counts is x' in the curve $Z'_3$ which is measured in consideration of disturbance of a magnet piece or a sensor, and an angle corresponding to −300 counts in another curve $Z''_3$ is x". In this example, the error between angle x' and angle x" is about 2° within a range of 30°, which means that there is an error range of about 7% or an error range of ±3.5% for the detected angle value.

Also, the sensors or magnets are not uniformly produced in the manufacturing process. Therefore, when calculating an angle, this lack of uniformity is regarded as a signal occurred by the actual relative motion, and an angle detected by a rotation angle detecting apparatus is not accurate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a rotation angle detecting method of a rotation angle detecting apparatus including hall elements and magnetic pieces includes detecting a first rotation angle based on a first measured magnetic value received from a first hall element, detecting a first magnetic value received from a second hall element corresponding to the first detected rotation angle, adjusting a gain based on a first difference value between a second measured magnetic value received from the second hall element, in response to one of the magnetic pieces being rotated at the first rotation angle, and the first magnetic value, redetecting a second rotation angle by applying the gain to the first magnetic value and redetecting a second magnetic value received from the second hall element, corresponding to the second rotation angle, and outputting the second rotation angle as a confirmed rotation angle in response to a second difference value between the second magnetic value and the second measured magnetic value becoming less than a delta value.

The first and second hall elements may be hall elements having magnetic values with most sensitive output waveform changes from respective output waveform changes of the hall elements.

Adjusting the gain may include increasing the gain by an adjustment value in response to the second difference value being greater than the first difference value.

Adjusting the gain may include decreasing the gain by an adjustment value in response to the second difference value being less than the first difference value.

Adjusting the gain may include changing the gain by an adjustment value, wherein the adjustment value differs depending on a result of a comparison between the first difference value and the second difference value.

At least two hall elements may be disposed such that relative motion directions and phases of the magnetic pieces coincide with a relative motion direction and a phase of a hall sensor including the at least two hall elements.

The detected magnetic value may be a magnetic value calculated using a function based on rotation angles of each of the hall elements.

The detected magnetic values may be magnetic values corresponding to rotation angles of each of the hall elements and stored in a look-up table.

The magnetic pieces may be spaced evenly at intervals along a circumference of a rotary body.

In another general aspect, a rotation angle detecting apparatus includes magnetic pieces located in a rotary body, a hall sensor including at least three hall elements configured to measure magnetic values of each of the magnetic pieces, and a signal processor configured to adjust a gain by applying a first measured magnetic value received from a first hall element to a second hall element and detecting a confirmed rotation angle, by calculating a first magnetic value by applying a first rotation angle detected based on the first measured magnetic value to a second hall element, adjusting a gain based on a first difference value between the first magnetic value and a second measured magnetic value received from the second hall element, in response to one of the magnet pieces being rotated at the first rotation angle, and the first detected magnetic value, and outputting the second rotation angle as the confirmed rotation angle based on a comparison result of a second difference value between a second magnetic value redetected based on the gain and the second measured magnetic value with the first difference value.

The signal processor may be configured to select two output waveforms in descending order of absolute values of differential values of output waveforms, out of the hall elements.

The signal processor may be configured to adjust the gain by increasing the gain by an adjustment value in response to the second difference value being greater than the first difference value and by decreasing the gain by the adjustment value in response to the second difference value being less than the first difference value.

The rotation angle detecting apparatus may further include storage for storing magnetic values corresponding to each of the rotation angles of the hall elements in a look-up table.

The signal processor may be configured to adjust the gain until the second difference value is less than a delta value and then redetect the second detecting rotation angle.

The magnetic pieces may be spaced evenly at intervals along a circumference of the rotary body.

Adjusting the gain may further include changing the gain by an adjustment value, wherein the adjustment value differs depending on a result of a comparison between the first difference value and the second difference value.

Other features and aspects will be apparent from the following detailed description, the drawings, and the claims.

BRIEF DESCRIPTION OF THE DRAWINGS

FIG. 11 is a look-up table in which function values are stored depending on degrees of a rotation angle detecting apparatus.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
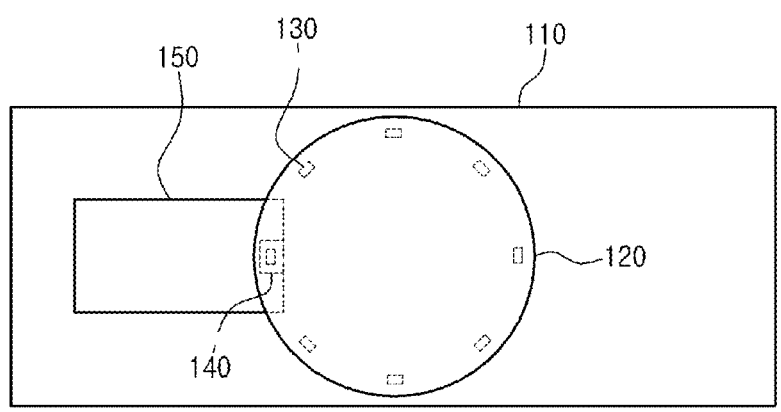
FIG. 1 is a schematic view of an example of a rotation angle detecting apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The following description relates to a rotation angle detecting method and an apparatus thereof that is capable of detecting a precise rotation angle for a rotary body, regardless of various errors such as tolerances in manufacture of magnetic pieces or hall sensors used for measuring such a rotation angle in the rotary body and mechanical tolerances generated when such a device is installed.

Figure 2:
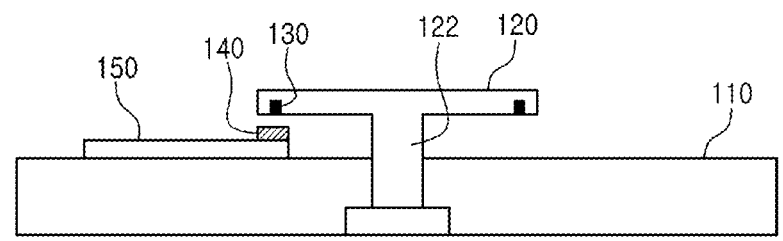
FIG. 2 is a side view of the rotation angle detecting apparatus illustrated in the example of FIG. 1.

FIG. 1 is a schematic view of an example of a rotation angle detecting apparatus, and FIG. 2 is a side view of the rotation angle detecting apparatus illustrated in the example of FIG. 1.

A rotation angle detecting apparatus of the present examples may be applied in all kinds of applications, such as in industries requiring measurements of distances, angles, and so on based on changes in measured magnetic fields. One example of a rotation angle detecting apparatus is a motor controller of an industry mechanism that measures a motor rotation angle and rotational velocity precisely. Another example is an automatic switchgear of a valve when measuring engine RPMs for an automobile, for use in a steering system that changes paths for cars and driving directions at a user's request. Other examples are an opening angle control device of a cover or a bezel rotational angle control device of a smartwatch, and so on. However, these are merely examples, and it will be apparent that the present examples have relevant applications in a number of relevant technological fields.

As illustrated in the example of FIGS. 1 and 2, a rotation angle detecting apparatus 100 may include a rotary body 120 that is mounted on a base member 110 in a method where the rotary body 120 can rotate. When the rotation angle detecting apparatus 100 is mounted in a wearable device such as a smartwatch, the base member 110 may be a dial of the smartwatch. In one example, the rotary body 120 is made of a plate member having the form of a disk, and in this case, the rotary body 120 is configured to rotate around a rotation axis 122 that may be one body together with the rotary body 120. In another example, the rotary body 120 is made of a plate member having the form of a ring. In other embodiment, the rotary body 120 has various forms, for example, such as having a planar side of a lower part but a convex or curved side of an upper part. The rotary body 120 in a standard state, meaning that the rotary body 120 is not rotated and is stopped, may be changed to a state in which the rotary body 120 is rotated by a certain degree as a result of a user's operation. In another example, the rotary body 120 may be formed so that it is rotated in a manner that is linked with the rotation of other members.

In the rotary body 120, a plurality of magnetic pieces 130 separated from each other by a predetermined angle may be mounted along a circumference of the rotary body 120. In one example, the plurality of magnetic pieces 130 is inserted into the lower part of the rotary body 120, as illustrated in the example of FIGS. 1-2. Each of the magnetic pieces 130 may be formed in various shapes, such as a circle, square, and rectangle. The illustrated example of FIGS. 1-2 gives an example that the number of the magnetic pieces 130 is eight, but the number of the magnetic pieces 130 is not limited to eight. For example, other numbers of the magnetic pieces 130 may be used. For example, when the number of the magnetic pieces 130 is eight, the magnetic pieces 130 are spaced apart evenly at intervals of 45 degrees along a circumference of the rotary body 120. When the number of the magnetic pieces 130 is twelve, the magnetic pieces 130 are spaced apart evenly at intervals of 30 degrees along the circumference of the rotary body 120. The magnetic pieces 130 may move along a first path in a circumferential direction along the surface of the rotary body 20 as the rotary body 120 rotates.

The rotation angle detecting apparatus 100 may include one or more hall sensors 140. In one example, the number of the one or more hall sensors 140 may be one or two, but is not limited thereby. Each hall sensor 140 may include at least three hall elements. In one example, all of the hall elements are planar hall elements. In another example, all of the hall elements are vertical hall elements. In yet another embodiment, at least one of the hall elements is a planar hall element and at least one hall element is a vertical hall element. As commonly known, a planar hall element is an element that detects the intensity of magnetic lines of force in a vertical direction and outputs a value of magnetic force in proportion to such a magnetic force, and a vertical hall element is an element that detects the intensity of magnetic lines of force in a horizontal direction and outputs a value of magnetic force in proportion to such a magnetic force.

According to an example illustrated in the example of FIG. 2, at least one hall sensor 140 is disposed to be separated downwards, starting from the lower part of the rotary body 120. At least one hall sensor 140 may be disposed so that the magnetic pieces 130 pass through the upper part of the hall element in serial order as the rotary body 120 rotates. In the example illustrated in FIGS. 1-2, one of the magnetic pieces 130 is opposite to the upper part of the hall sensor 140 while the rotary body 120 is at the standard location. Furthermore, an adjacent magnet piece 130 passes through the upper part of the hall sensor 140 when the rotary body 120 is rotated by more than 29 degrees. Furthermore, when the rotary body 120 is rotated by more than 59 degrees at the standard location, two adjacent magnetic pieces 130 pass through the upper part of the hall sensor 140 in consecutive order. In this manner, the greater an angle of rotation of the rotary body 120 is, the greater a number of magnetic pieces 130 that pass through the upper part of the hall sensor 140, accordingly. In one example, when the rotary body 120 is at the standard location, the hall sensor 140 and the magnetic pieces 130 may be spaced apart in a particular manner that facilitates using the hall sensor 140 to track the motion of the magnetic pieces 130.

The rotation angle detecting apparatus 100 may further include a circuit board 150 having at least one hall sensor 140. The circuit board 150 may further include an electronic circuit configured to detect a rotation angle of the rotary body 120 corresponding to the current rotation state of the rotary body 120 in response to the measured output of the hall sensor 140.

Figure 3:
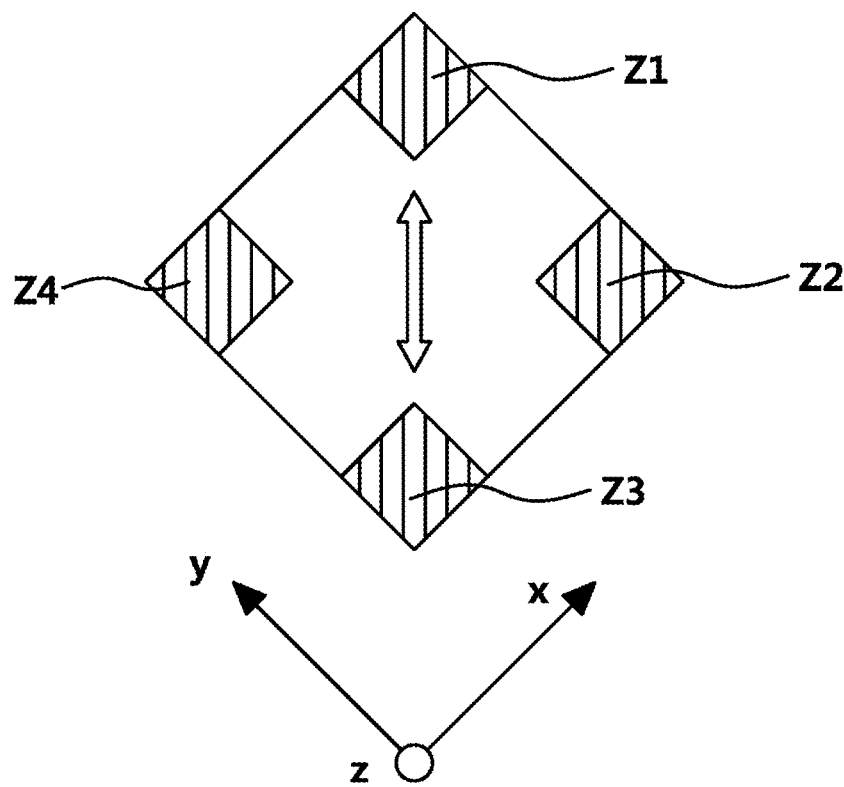
FIG. 3 is a diagram of the hall sensor of the example of FIG. 1.

FIG. 3 is a diagram of the hall sensor illustrated in the example of FIG. 1.

Referring to the example of FIG. 3, a hall sensor 140 of the rotation angle detecting apparatus 100 includes at least individual three hall elements. In this example, the hall elements that form the hall sensor 140 are disposed to be consistent with the relative motion direction of a magnet piece 130 with respect to the hall sensor, indicated by an arrow in FIG. 3, and with the phase, which is done for maximizing phase differences generated due to the hall elements in a moving direction.

Figure 4:
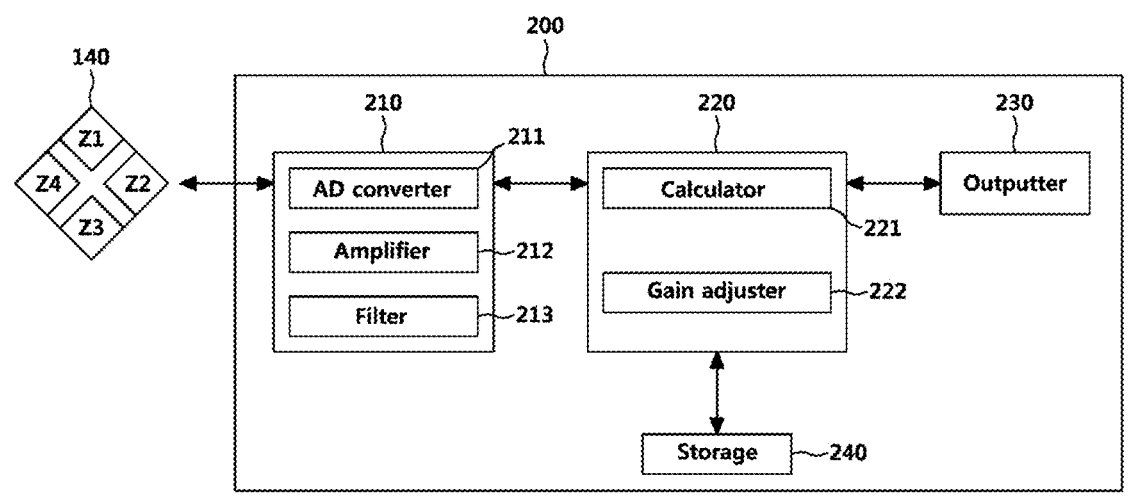
FIG. 4 is a diagram of configuration of an example of a rotation angle detecting apparatus.

FIG. 4 is a diagram of the structure of an example of a rotation angle detecting apparatus.

Referring to the example of FIG. 4, an electronic circuit 200 included as all or part of a circuit board 150 of the rotation angle detecting apparatus 100 includes a signal pre-processor 210, a signal processor 220, and an outputter 230.

In the example of FIG. 4, the signal pre-processor 210 may convert an analog signal detected by a hall sensor into a digital signal and amplify the digital signal and filter noise from the digital signal. Thus, the signal pre-processor 210 performs operations on the signal so that it is prepared for the signal processing by the signal processor 220.

The signal pre-processor includes, for example, an AD converter 211, an amplifier 212, and a filter 213 to perform the above functions.

The signal processor 220 selects two most sensitive hall elements whose output waveform is changed from a plurality of hall elements. That is, the output waveforms of two hall elements are selected in the descending order of a magnitude of a differential value of an output waveform of the hall elements. At this time, the output waveform may be expressed by a sum of sine functions, due to the way the hall elements are moved when measuring.

The signal processor 220 may include, for example, a calculator 221 and a gain adjuster 222.

The calculator 221 applies a first measurement magnetic value of a first hall element to a second hall element, thereby adjusting a gain and detecting a confirmed magnetic value. The calculator 221 applies a first detection rotation angle that is detected based on the first measurement magnetic value to a second hall element, thereby calculating a prior second detection magnetic value. The calculator 221 re-calculates the second detection magnetic value by using a gain adjusted based on a first difference value between a magnetic value measured from the second hall element that is rotated by the first detection rotation angle and the prior second detection magnetic value. The calculator 221 outputs the first detection rotation angle as a confirmed rotation angle based on a comparison of the first difference value and a second difference value between the second detection magnetic value and the measured magnetic value of the second hall element. In addition, the calculator 221 outputs the first detection rotation angle as a determined angle when the second difference value becomes less than a predetermined delta value.

The gain adjuster 222 performs adjustment in order to increase a gain by an adjustment value if the second difference value is greater than the first difference value, and adjusts to decrease a gain by the adjustment value if the second difference value is less than the first difference value. The adjustment value may be a predetermined value, and may be one constant adjustment value in an example, or two constants having different steps based on a comparison result in another example.

For example, the gain adjuster 222 adjusts to increase a gain where $\alpha=1$ by an adjustment value of 0.05, such that the gain $\alpha=1+0.05=1.05$ is obtained, if the second difference value is greater than the first difference value, and the gain adjuster 221 adjusts to decrease the gain by an adjustment value of 0.025 such that the gain $\alpha=1.05-0.025=1.025$ is obtained if the second difference value is less than the first difference value. If plural adjustment values are used, such that the amount of adjustment differs depending on the result of the comparison, the calculation speed for detecting a rotation angle by used, the rotation angle detecting apparatus may be slower but its accuracy is increased.

The rotation angle detecting apparatus may also include storage 240. The storage 240 stores magnetic values corresponding to each of a plurality of rotation angles in a look-up table. Further details of such a storage 240 will be provided, below, when describing FIG. 11.

The outputter 230 outputs the confirmed rotation angle. The outputter 230 may output the measured magnetic value or the detected magnetic value from which the disturbance is eliminated.

Figure 5:
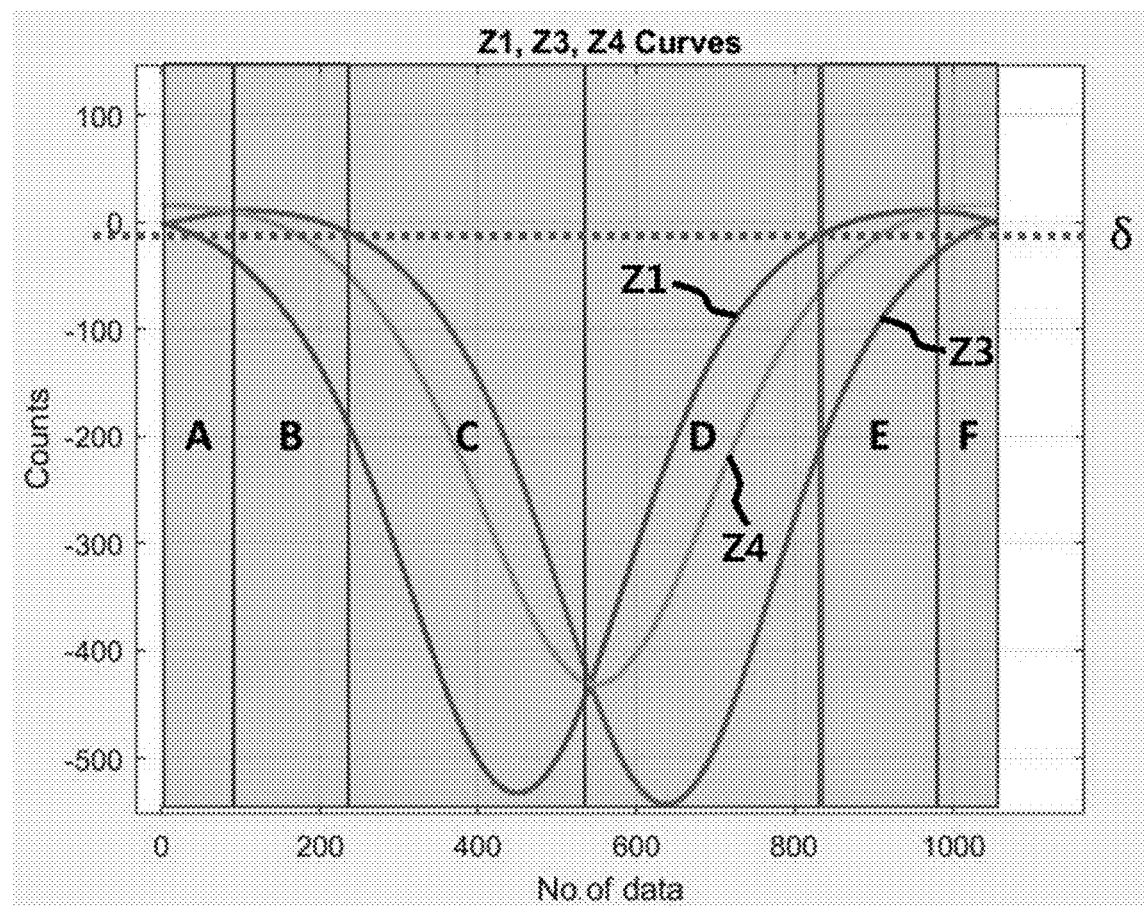
FIG. 5 is a graph showing output waveforms of hall elements obtained by rotating a rotary body from 0 degree to 29 degrees in a hall sensor of a rotation angle detecting apparatus.
Figure 6:
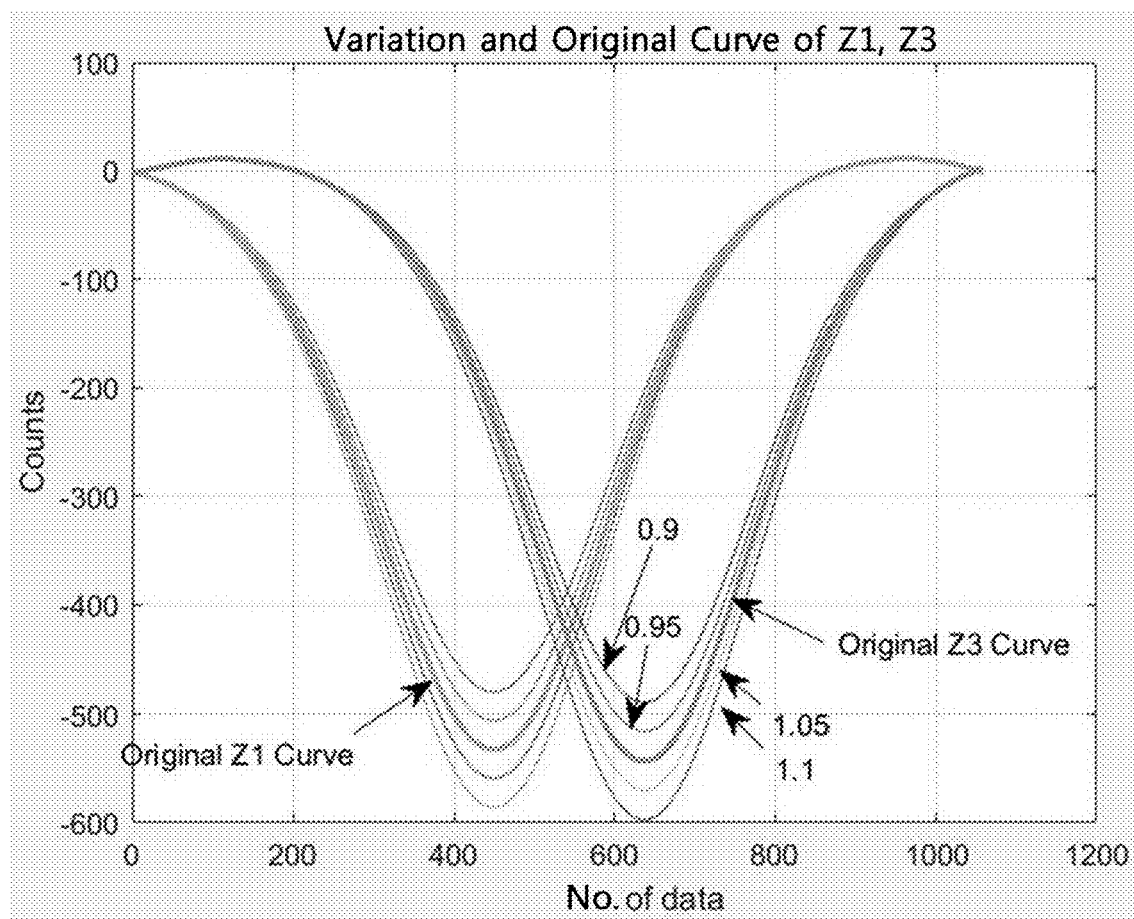
FIG. 6 is a graph of waveforms in which gains are applied to two outputs selected from the output waveforms shown in the example of FIG. 5.
Figure 7:
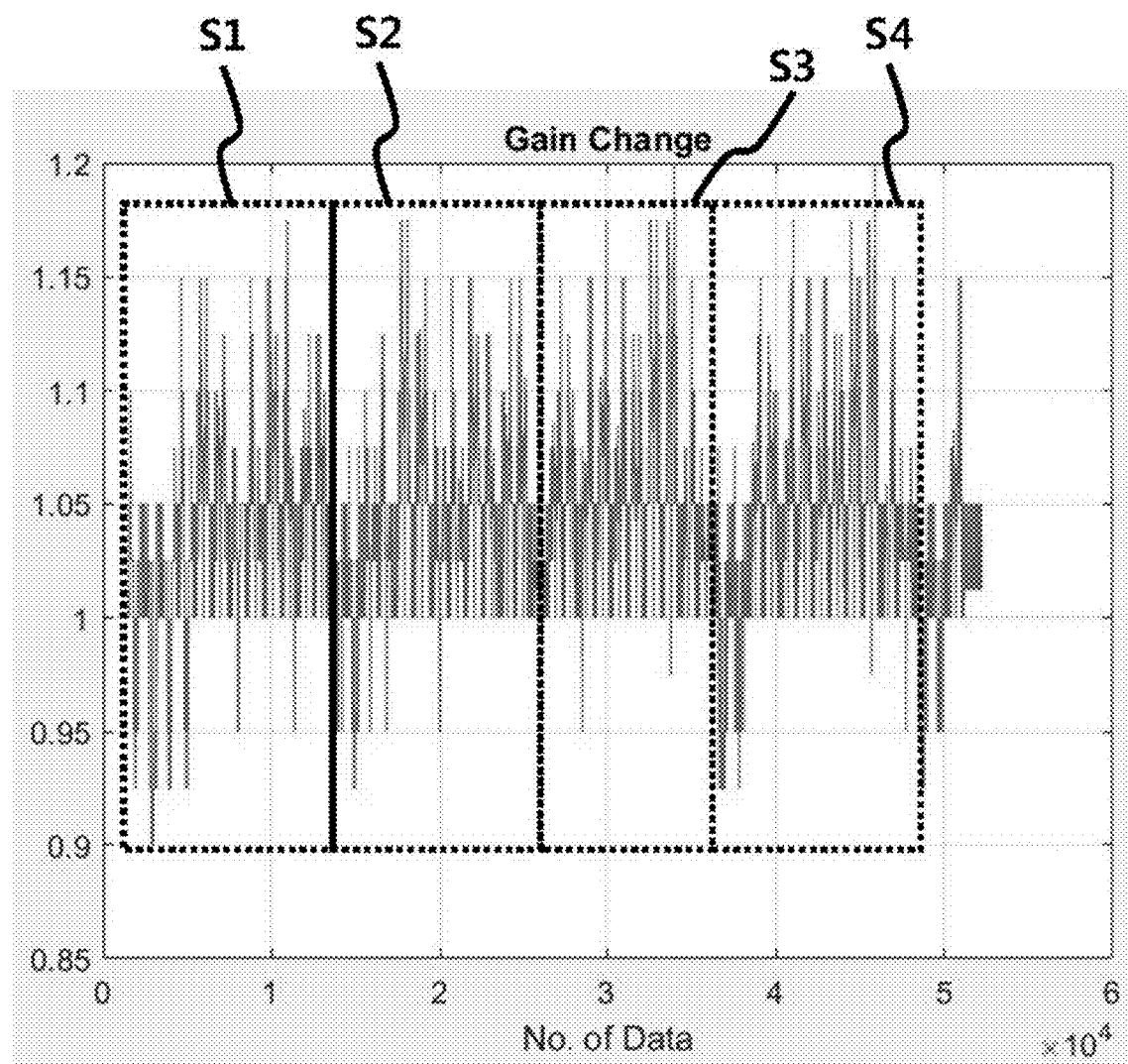
FIG. 7 is a graph showing changes of the gains applied to the example of FIG. 6.

FIG. 5 is a graph of output waveforms of hall elements obtained by rotating a rotary body by from 0 degree to 29 degrees in a hall sensor of the example rotation angle detecting apparatus. FIG. 6 is a graph of waveforms in which gains are applied to two outputs selected from the output waveforms shown in the example of FIG. 5. FIG. 7 is a graph showing the changes of gains applied to example of FIG. 6.

Referring to the example of FIG. 5, with respect to the example of hall element $Z_4$, the location with respect to a magnet is different from that of hall element $Z_1$ or hall element $Z_3$, so the amplitude and offset of the output waveform of hall element $Z_4$ is observed to be outputted as being different, compared to those of hall element $Z_1$ or hall element $Z_3$.

Figure 16:
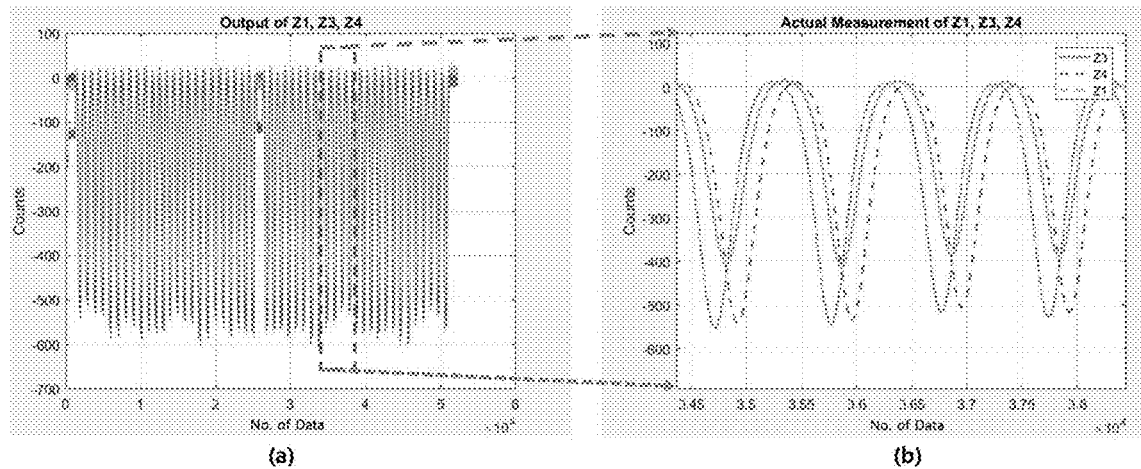
FIG. 16 shows graphs for explaining an alternative art related to a rotation angle detecting apparatus.
Figure 17:
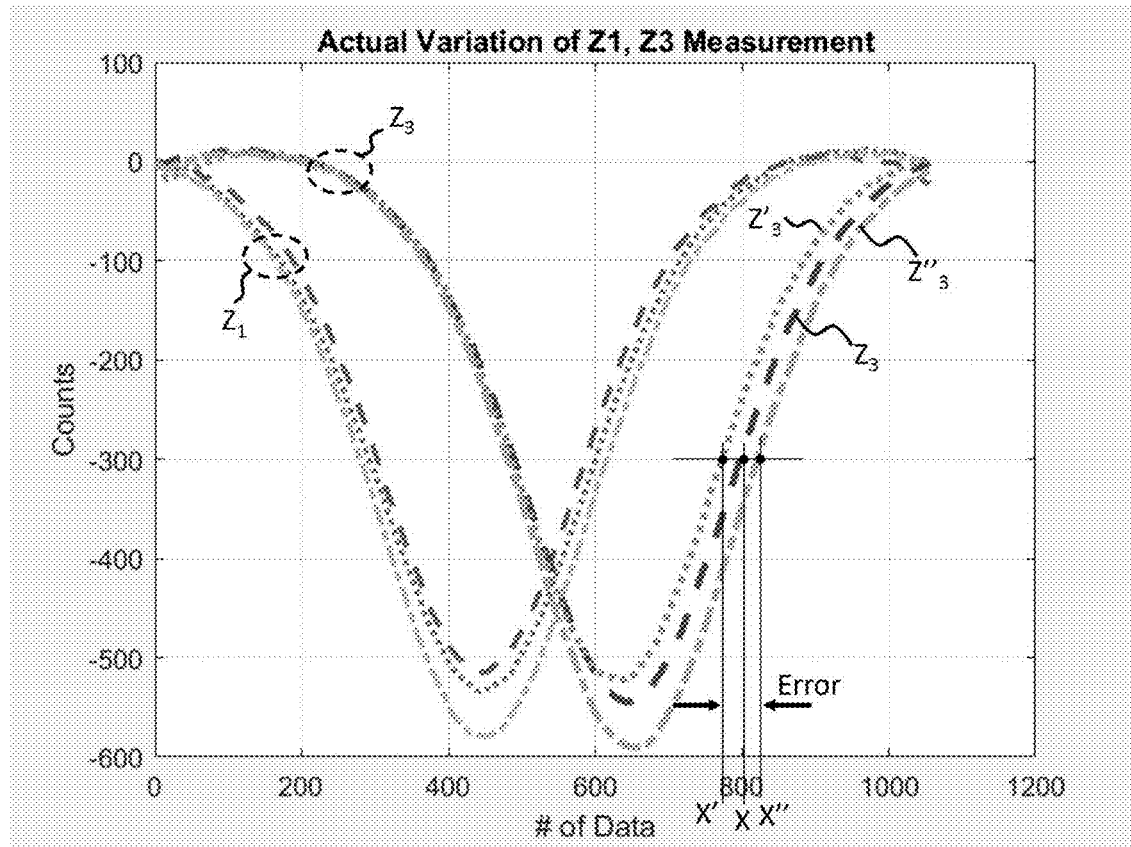
FIG. 17 is a graph for explaining an alternative art related to a rotation angle detecting apparatus.

When the hall element illustrated in FIG. 3 is rotated by 360 degrees, the output waveforms in a quantity corresponding to the number of all of the hall elements may be obtained as illustrated in FIG. 16 at (a), but when the rotation angle detecting apparatus 100 calculates an angle at a first 30-degree section, proceeds and adjusts to each of the next 30-degree sections, the measured value is continuously extended to output the entire range of 0 to 360 degrees. In this description, examples are described as being able to calculate an angle of 0 to 29 degrees, and examples use two output waveforms from two different hall elements in order to obtain an approximation of a measured angle x and a corresponding gain α.

When selecting two output waveforms, the rotation angle detecting apparatus 100 distinguishes and selects each section for an approximate solution of an angle x and a gain α. More specifically, each of the output waveforms may be calculated as a function, that is, a curve equation, and two output waveforms may be selected based on a differential value of the curve equation. Subsequently, a process of calculating output waveforms as a function of a curve equation will be described in greater detail.

Referring to the example of FIG. 5 and the example of FIG. 16, examples assume magnetic values measured from each hall element do not have a specific disturbance. Accordingly, a distance starting from the middle of a magnet to the middle of the next magnet is set as being a section, and the measured values of each section are superimposed. The waveform of the superimposed measured magnetic value is presented to correspond to the number of the magnetic pieces 130. An intermediate value or average value of the superimposed values is set as a reference value for measured magnetic values. In an example, a reference value of measured magnetic values for hall element 1 may be expressed by Equation 1, below.

$$Z_1 = a_{11}\sin(b_{11}\cdot x + c_{11}) + a_{21}\sin(b_{21}\cdot x + c_{21}) + a_{31}\sin(b_{31}\cdot x + c_{31}) + a_{41}\sin(b_{41}\cdot x + c_{41})$$ (Equation 1)

In Equation 1, $a_{11}$, $a_{21}$, $a_{31}$, $a_{41}$, $b_{11}$, $b_{21}$, $b_{31}$, $b_{41}$, $c_{11}$, $c_{21}$, $c_{31}$, and $c_{41}$ are constants that define a function of the reference measured value $Z_1$, and the function is a sum of sine functions. In the present description, Equation 1 is described by using a sum of sine function, but it may be described by a sum of cosine functions instead. The constants for Equation 1 may be easily obtained by using a curve fitting method which uses a predetermined program to ascertain which constants will result in the appropriate relationship between $Z_1$ and x.

Equation 1 is expressed more simply as Equation 2.

$$Z_1 = \sum_{i=1}^{4} a_{i1}\sin(b_{i1}\cdot x + c_{i1})$$ (Equation 2)

In a similar manner, Z functions for hall elements 3 and 4 may be expressed by Equations 3 and 4, respectively.

$$Z_3 = \sum_{i=1}^{4} a_{i3}\sin(b_{i3}\cdot x + c_{i3})$$ (Equation 3)

$$Z_4 = \sum_{i=1}^{4} a_{i4}\sin(b_{i4}\cdot x + c_{i4})$$ (Equation 4)

That is, a Z function for output waveforms of each hall element may be expressed by Equation 5, accordingly.

$$Z_j = \sum_{i=1}^{4} a_{ij}\sin(b_{ij}\cdot x + c_{ij})$$ (Equation 5)

Here, $a_{ij}$, $b_{ij}$, and $c_{ij}$ are values that vary depending on the characteristics of the rotation angle detecting apparatus and may be obtained by an experimental measurement, i is an index indicating the order of a sine function, and j is a number of the hall element.

Assuming that a measured magnetic value is measured without any disturbance in order to use the output waveforms of in the each hall element, this relationship may be expressed as a function of angle x.

Equations 6, 7, and 8 represent magnetic values measured by the change of angle in the hall elements according to the function Z.

$$m_1 = Z_1(x)$$ (Equation 6)

$$m_3 = Z_3(x)$$ (Equation 7)

$$m_4 = Z_4(z)$$ (Equation 8)

In the above Equations 6, 7, and 8, x is an variable angle, $m_1$, $m_3$, and $m_4$ are magnetic values of the hall sensors 1, 3, and 4, respectively, and $Z_1$, $Z_3$, and $Z_4$ are the functions expressed by Equation 5, which are intended to relate x values with corresponding magnetic values of the hall sensors.

If a disturbance occurs in the rotation angle detecting apparatus 100, as illustrated in the example of FIG. 6, Equations 9, 10, and 11 may be expressed as applying a corresponding gain α to Equations 6, 7, and 8, respectively.

$$m_1 = a\cdot Z_1(x)$$ (Equation 9)

$$m_3 = a\cdot Z_3(x)$$ (Equation 10)

$$m_4 = a\cdot Z_4(x)$$ (Equation 11)

The rotation angle x is not fully obtained by the magnetic values m1, m3, and m4 alone of hall sensors 1, 3 and 4 in Equations 9, 10, and 11, but it may be obtained by knowing an appropriate gain α for considering disturbances.

In order to obtain the gain α, two function curves may be selected in each section from three output waveforms illustrated in the example of FIG. 5, hereinafter referred to as the function curves of Equations 9, 10, or 11, which acts to exclude a function curve whose variation is the lowest from the three function curves to improve the accuracy and sensitiveness of the rotation angle detecting apparatus.

As described further above, the rotation angle detecting apparatus 100 deduces the output waveforms of hall elements as function curves and selects two function curves per curve section based on absolute values of differential values of function curves of each hall element, according to an example. Referring to the example of FIG. 5, an output waveform with one interval between the middle of a magnet and the middle of the next magnet is divided into sections A to F based on absolute values of differential values of three curves.

In the present examples, three function curves are provided initially, but only two functions are sufficient to calculate a rotation angle x and a gain α, that is, the required two unknown values. Therefore, two functions may be selected per section and there is a criterion for the selection when selecting two functions, such as from the provided three functions. For example, such a criterion may be a criterion to find a value to enable the difference between the function values obtained by an actual rotation angle x and the function values obtained by its approximate value x' to be more sharply converged.

According to an example, when finding an approximate value x', an interpolation may be used and the gradient of a function, that is, a differential value of the function, is used accordingly. If the differential value of the function is relatively great, the variation of a magnetic value is big as well, so the difference between the function values is sharply converged as desired, and thus, the differential value of the function may be used as the criterion for selecting a function. That is, the uppermost two curves are selected in descending order of the absolute values of the differential values of the function curve. For example, the absolute value of the differential value of the function $Z_4$ is the lowest in section A of function curves illustrated in FIG. 5. Therefore, the functions $Z_1$ and $Z_3$ are selected to find a value, and function $Z_4$ is excepted. In addition, in section B, the differential value of the function Z3 is the lowest, so a value is obtained by using the functions $Z_1$ and $Z_4$, and in the corresponding manner, in section C, a value is obtained by using the functions $Z_1$ and $Z_3$. In section D, the functions $Z_1$ and $Z_3$ are used because section D is symmetrical to the section C. In section E, the functions $Z_1$ and $Z_4$ are used because the section is symmetrical to the section B. In section F, the functions $Z_1$ and $Z_3$ are used because the section is symmetrical to the section A.

In another example, it may be inappropriate to merely consider a differential value as a sole criterion when selecting a function curve, so selection of a function curve may be determined by considering a threshold value in addition to the differential value. That additional criterion may be relevant because the functions of FIG. 5 do not represent all types of the functions that are used in real examples. The form of the function is influenced by some factors, such as the size of the magnets generally used, that is, the shape, a magnetic intensity, the material of the magnet, a gap between a sensor and the magnet, and so on.

In detail, when selecting the functions in sections B, C, D, and E in the example of FIG. 5, it may be unreasonable to consider only a differential value. Therefore, in this example, the function curve may be selected by considering a predetermined threshold value as well as a differential value of the function. The threshold value, hereinafter referred to as "δ," may be experimentally determined, and it is selected by observing the variation in differential values of each function in actual use. In the example of FIG. 5, a function curve is selected based on a specific value within a range of about −20 to −100, but the numerical value of the threshold value is not limited to such particular examples, and may be set differently depending on various examples.

Thus, the rotation angle detecting apparatus 100 may calculate a rotation angle x and a gain α from two function curves selected from the measured values $Z_1$, $Z_3$, and $Z_4$, as discussed above. A method for obtaining the gain α is to be described further when describing the examples of FIGS. 8 to 10. When applying a gain α to an original Z curve which is determined based on Equation 5, it is illustrated as per the example of FIG. 6.

The function curves illustrated in the example of FIG. 6 are obtained by changing the gain α by 0.05 in a range from 0.9 to 1.1. When applying a proper gain α to the function curves of Equations 9, 10 and 11, the calculated function curves in FIG. 6 will approach the actual measured output waveforms in the example of FIG. 16.

Referring to the example of FIG. 7, a gain α changes in a range from 1.2 to 0.9 during each predetermined sampling period. That is, it may be observed that the gain α of a rotation angle detecting apparatus 100 shows a similar change tendency within a certain range S1, S2, S3 and S4 for every rotation sampling period.

Figure 8:
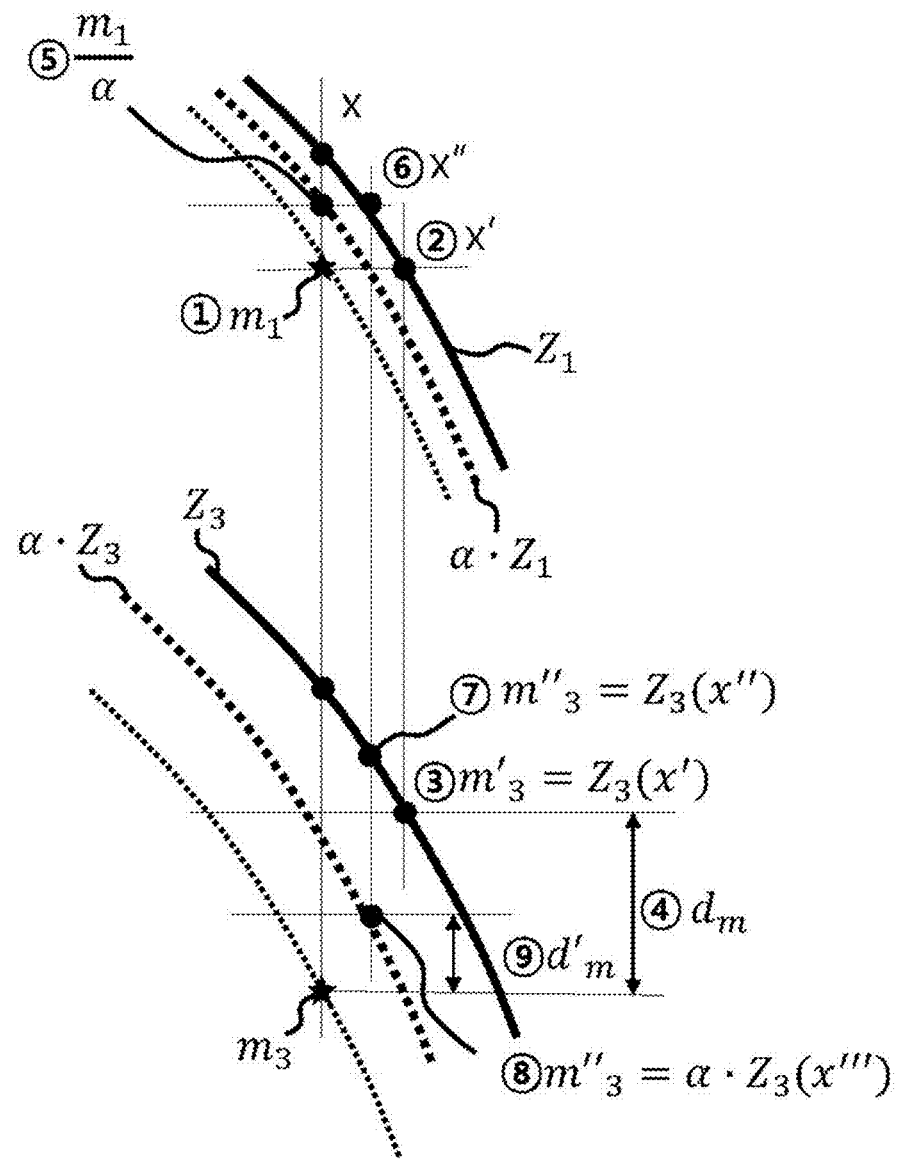
FIG. 8 is a conceptual graph for explaining a rotation angle detecting method of a rotation angle detecting apparatus.

FIG. 8 is a conceptual diagram for explaining a rotation angle detecting method of a rotation angle detecting apparatus. For convenience of explanation, it is assumed that a confirmed rotation angle is obtained using output waveforms of hall element 1 and hall element 3, that is, their function curves, as an approximate value or approximate solution of an actual rotation angle x.

First, it is assumed that a first measurement magnetic value m1 at label ① of FIG. 8 measured from hall element 1 has gain α=1 with no disturbance. Under this assumption, the method puts the first measurement magnetic value m1 into Equation 6, then a first detection rotation angle x' is obtained.

$$m_1 = Z_1(x') \quad \text{(Equation 12)}$$

That is, the first detection rotation angle x' may be obtained using the first measurement magnetic value $m_1$ as expressed in Equation 12. However, the first detection rotation angle x' is a value in which a disturbance is applied, and it differs from an actual rotation angle x.

A first detection magnetic value m'$_3$ predictable in the hall element 3 is obtained using the first detection rotation angle x' at label ③ of FIG. 8. At this time, because it is an example where the gain is assumed to be α=1 having no disturbance, the prediction may be expressed as Equation 13 on the basis of Equation 7.

$$m_3' = Z_3(x') \quad \text{(Equation 13)}$$

The first detection magnetic value m'$_3$ is a magnetic value calculated from the first detection rotation angle x' rather than from the first measurement rotation angle x, so it differs from a second measurement magnetic value $m_3$ actually measured from hall element 3, as shown in FIG. 8 at label ④.

$$d_m = |m_3 - m_3'| \quad \text{(Equation 14)}$$

Equation 14 is expressed under an assumption that a difference between the second measurement magnetic value $m_3$ and the first detection magnetic value m'$_3$ is denoted as $d_m$. If the detected rotation angle x' gets further away from the actual rotation angle x, the $d_m$ becomes greater.

At this time, the rotation angle detecting apparatus 100 may increase or decrease the gain α by a predetermined unit step, as expressed in Equation 15, so that the first detection rotation angle x' comes closer to the actual rotation angle x.

$$\alpha = \alpha + \text{step} \quad \text{(Equation 15)}$$

Equation 16 indicates the operation to modify the first measurement magnetic value $m_1$ by reflecting the gain α adjusted by Equation 15.

$$m_1 = \frac{m_1}{\alpha} \quad \text{(Equation 16)}$$

The modified first measurement magnetic value $m_1/\alpha$ is located above the first measurement magnetic value $m_1$, as illustrated in FIG. 8 because the measured values are expressed as negative numbers and the gain α has a greater value than 1.

A second detection rotation angle x" is obtained by putting the modified first measurement magnetic value $m_1/\alpha$ into Equation 6, as shown in FIG. 8 at label ⑥. At this time, a second detection magnetic value m"$_3$, that is, Z$_3$(x"), is obtained by using the second measurement rotation angle x" and Equation 7 as shown in FIG. 8 at label ⑦.

However, because the gain α is adjusted by one unit step in the initial value 1 due to the occurrence of disturbance, a function curve reflecting the adjusted gain, that is, putting a second detection rotation angle x" into Equation 11, is expressed as Equation 17 as shown in FIG. 8 at label ⑧.

$$m_3'''Z_3(x'') \quad \text{(Equation 17)}$$

According to Equation 17, a second detection magnetic value is m'''$_3$, but the second measurement magnetic value is m$_3$; therefore, there is a difference of d'$_m$ between them as shown in FIG. 8 at label ⑨. However, it may be seen that d'$_m$ becomes less, as compared with d$_m$, when an initial set gain is reflected, and a gap between the actual rotation angle x and the second detection rotation angle x" becomes narrower.

In the present examples, if a second detection magnetic value is re-detected in a manner that d$_m$ is decreased by using the way of detecting a rotation angles as mentioned above, the second detection rotation angle corresponding to the re-detected second detection magnetic value may be obtained as an approximate value of the actual rotation angle x.

Figure 9:
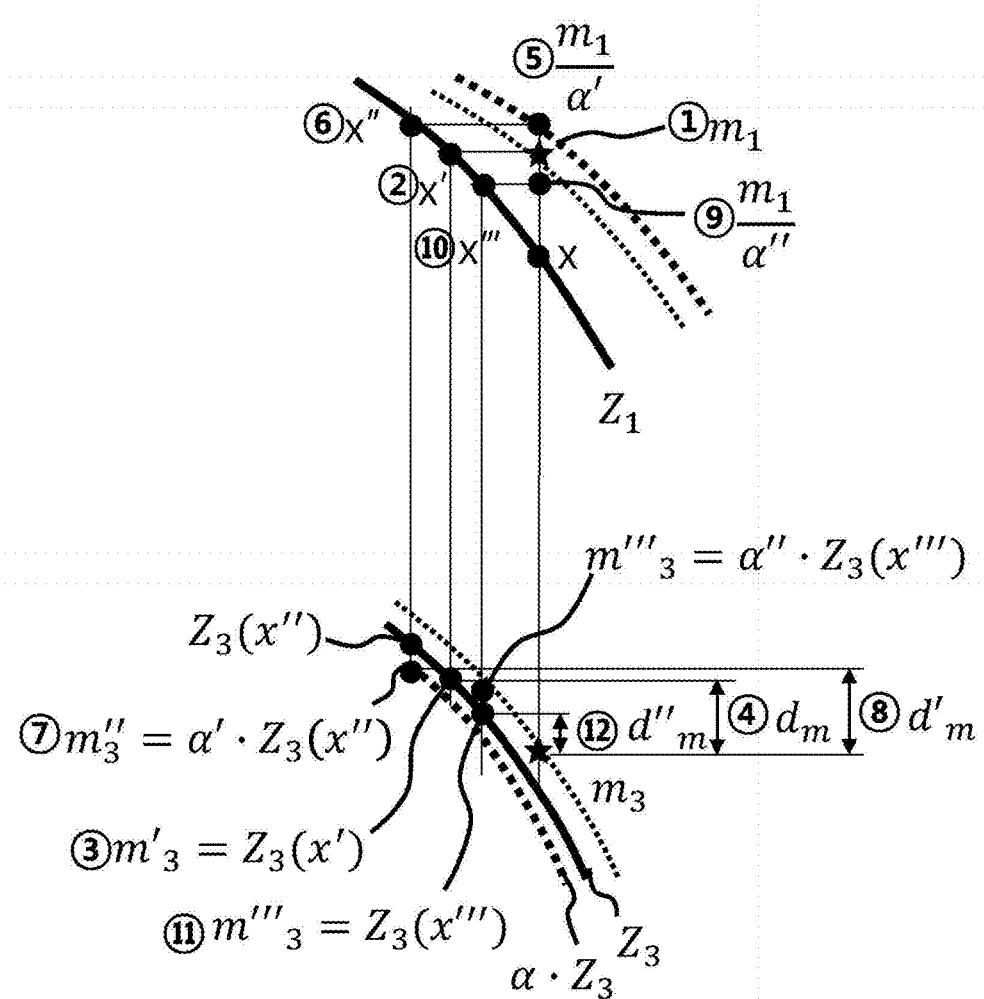
FIG. 9 is a conceptual graph for explaining a rotation angle detecting method of a rotation angle detecting apparatus.

FIG. 9 is a conceptual view for explaining a method for detecting rotation angles of a rotation angle detecting apparatus.

Referring to the example of FIG. 9, first, it is assumed that a first measurement magnetic value m1 measured in hall element 1 is in an example in which gain α=1, thus having no disturbance as shown in FIG. 9 at label ①. At this time, a first detection rotation angle x' is obtained by substituting the first measurement magnetic value m$_1$ in Equation 6 as shown in FIG. 9 at label ②.

The first detection rotation angle x' may be obtained from the first measurement magnetic value m$_1$, as expressed in Equation 12, but the first detection rotation angle x' is a value to which a disturbance is applied and differs from an actual rotation angle x.

A first detection magnetic value m'$_3$ predictable in hall element 3 is obtained by putting the first detection rotation angle x' into Equation 13 as shown in FIG. 9 at label ③.

Because the first detection magnetic value m'$_3$ is a magnetic value calculated not from the first measurement rotation angle x but the first detection rotation angle x', there is a difference between the first detection magnetic value m'$_3$ and a second measurement magnetic value m$_3$ actually measured in hall element 3 as shown in Equation 14 as shown in FIG. 9 at label ④.

Therefore, the rotation angle detecting apparatus 100 adjusts the gain α by increasing by a predetermined unit step as shown in Equation 15.

A modified first measurement magnetic value m$_1$/α' is used to adjust the first measurement magnetic value m$_1$ by reflecting the adjusted gain α', which is accordingly adjusted based on Equation 15, and as shown in Equation 16, as shown in FIG. 9 at label ⑤.

The modified first measurement magnetic value m$_1$/α' is located above the first measurement magnetic value m$_1$, as illustrated in the example of FIG. 9, because the measured values are expressed by negative values and the adjusted gain α has a greater value than 1.

A second detection rotation angle x" is obtained by putting the modified first measurement magnetic value m$_1$/α' into Equation 6 as shown in FIG. 9 at label ⑥. At this time, a second detection magnetic value m"$_3$, that is, Z$_3$(x"), will be obtained by using the second detection rotation angle x" and Equation 7 as shown in FIG. 9 at label ⑦.

The second detection magnetic value that is detected by an adjusted gain α' is m'"$_3$, but the second measurement magnetic value is m$_3$. Hence, there is a difference of d'$_m$ between these values as shown in FIG. 9 at label ⑧. At this time, compared with a d$_m$ of an example in which an initial set gain is reflected, d'$_m$ becomes greater. Therefore, the adjusted gain α' may be adjusted again accordingly.

That is, because the rotation angle detecting apparatus has a value of d'$_m$ greater than d$_m$, the gain is adjusted by decreasing by a predetermined unit step rather than increasing the gain by a unit step based on a comparison result.

$$\alpha' = \alpha' - \text{step} \quad \text{(Equation 18)}$$

A modified first measurement magnetic value m$_1$/α" is used to adjust the first measurement magnetic value m$_1$ by reflecting the gain α' according to Equation 15 and Equation 16 as discussed above, as shown in FIG. 9 at label ⑨.

The modified first measurement magnetic value m$_1$/α' is located under the first measurement magnetic value as being divided by m$_1$ as shown in FIG. 9 at label ⑨ because the measured values are negative values and the gain α is less than 1.

A second detection rotation angle x'" is obtained by putting the modified first measurement magnetic value m$_1$/α" into Equation 6 as shown in FIG. 9 at label ⑩. At this time, the modified second detection magnetic value m'"$_3$, that is, Z$_3$(x'") is obtained using the second detection rotation angle x'" as shown in FIG. 9 at label ⑪.

A second difference value between the second detection magnetic value m'"$_3$ and the second measurement magnetic value m3 is d"$_m$ as shown in FIG. 9 at label ⑫, and such a second difference value becomes less than a first difference value d$_m$. It can be seen that the difference between the actual rotation angle x and the second detection rotation angle x'" becomes smaller in proportion to the decreased difference value.

If a second detection magnetic value is re-detected in a manner such that d$_m$ decreases using the method for detecting a rotation angle, as described above, a second detection rotation angle corresponding to the second detection magnetic value is obtained as an approximate value of the actual rotation angle x.

Figure 10:
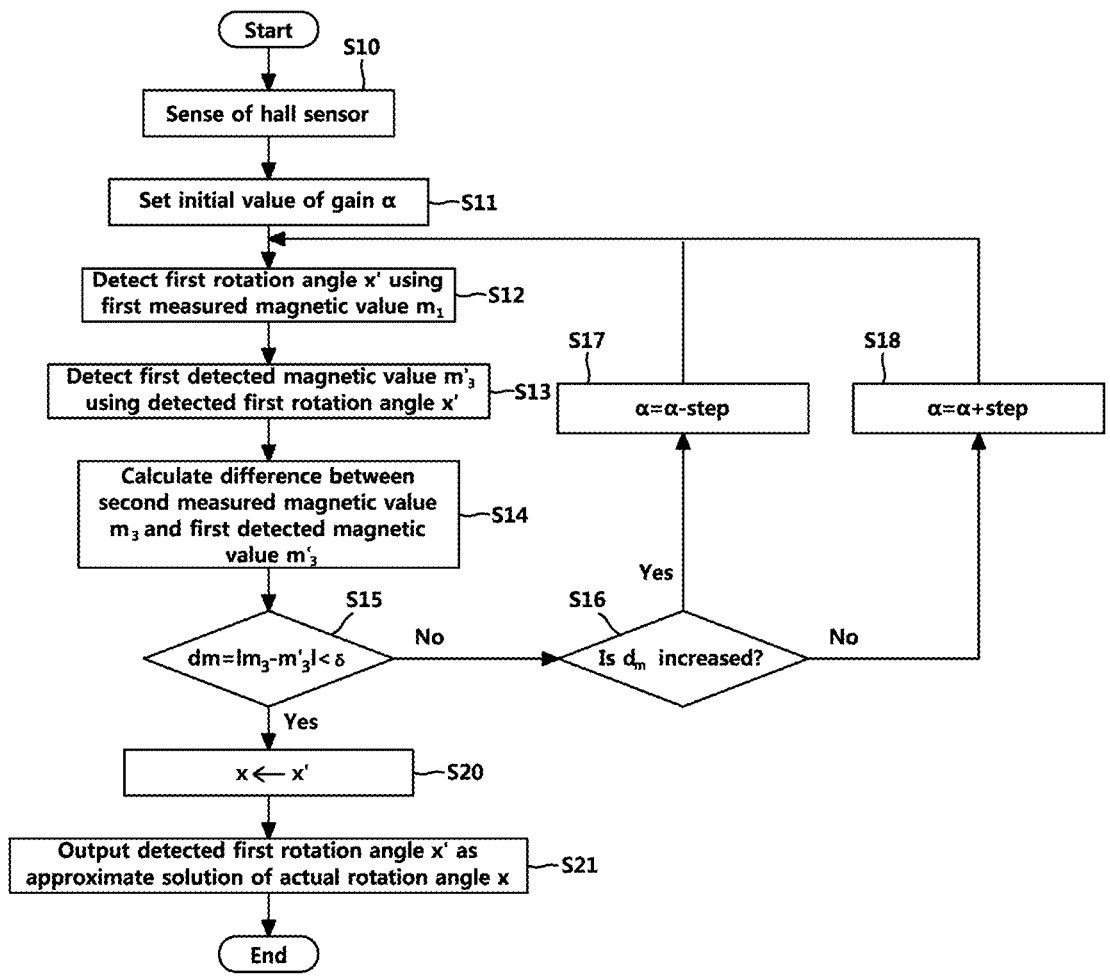
FIG. 10 is a flowchart for explaining a rotation angle detecting method of a rotation angle detecting apparatus.

FIG. 10 is a flowchart for explaining a method for detecting a rotation angle of a rotation angle detecting apparatus.

Referring to the example of FIG. 10, a rotation angle detecting apparatus 100 senses magnetic field changes of magnetic pieces moving with the rotation of a rotary body by at least one hall sensor at operation S10. At this time, each hall sensor includes a plurality of hall elements, and for convenience of explanation, an example is considered in which each of the hall sensors includes at least two hall elements having the same direction of relative motion of the magnetic pieces. However examples are not limited in this manner, and other examples may include different configurations for the hall sensors, modified appropriately to achieve successful results.

A rotation angle detecting apparatus 100 sets an initial value of gain α in operation S11, for example, an initial gain α is set to 1, and then detects a first detection rotation angle x' based on a first measurement magnetic value m$_1$ measured in a first hall element in operation S12. The detected rotation angle x' is an approximate solution of an actual rotation angle x, and the detected rotation angle x' may be calculated using a predetermined function such as Equation 5 according to an example or calculated from a look-up table in which magnetic values corresponding to a rotation angle are stored, according to another example.

The rotation angle detecting apparatus 100 obtains a first detection magnetic value $m'_3$ corresponding to the first detection rotation angle x' in operation S13, compares the first detection magnetic value $m'_3$ with a second measurement magnetic value $m_3$ in operation S14, and compares a first difference value $d_m$ with a predetermined threshold value δ in operation S15.

If the first difference value $d_m$ is greater than the predetermined threshold value δ, the rotation angle detecting apparatus 100 re-detects a detected rotation angle and a detected magnetic value by adjusting for an increase or a decrease in the gain.

In further detail, the rotation angle detecting apparatus 100 adjusts for decrease in the gain in operation S17 and applies the adjusted gain, and then re-detects a second detection rotation angle x" based on the first measurement magnetic value in operation S12. The rotation angle detecting apparatus 100 obtains the second detection magnetic value $m''_3$ in a second hall element by using the second detection rotation angle x" in operation S13 and calculates a second difference value $d'_m$ with respect to the second measurement magnetic value $m_3$.

The rotation angle detecting apparatus 100 re-detects a detected rotation angle and a detected magnetic value by adjusting for increase or decrease in the gains again if the second difference value $d'_m$ is greater than the predetermined threshold value δ.

The first difference value $d_m$ and the second difference value $d'_m$ are compared with each other in operation S16. If the first difference value $d_m$ is less than the second difference value $d'_m$, that is, if a difference value is increased, the gain is adjusted to be decreased in operation S17. If the first difference value $d_m$ is greater than the second difference value $d'_m$, that is, if the difference value is decreased, the gain is adjusted to be increased in operation S18. Accordingly, operations S12 to S15 are repeated by applying the adjusted gain.

The rotation angle detecting apparatus 100 updates a difference value $d_m'$ by using the adjusted gain α, and if the difference value $d_m'$ is less than the determined δ, detects a corresponding second detection rotation angle x' as a confirmed rotation angle that is an approximate solution of an actual rotation angle x in operation S20, and outputs a confirmed rotation angle x'.

FIG. 11 is an example of a look-up table in which function values depending on degrees of a rotation angle detecting apparatus are stored.

The look-up table of the example of FIG. 11 is a table showing values of a predefined function expressed as per Equation 5. Column 1 of the table in the example of FIG. 11 shows rotating degree amounts, and columns 2 to 4 are magnetic values corresponding to these degrees of hall elements 1, 3, and 4, respectively. That is, the look-up table shows magnetic values for each hall element depending on corresponding rotation angles.

The look-up table illustrated in the example of FIG. 11 may be configured differently depending on the number of magnetic pieces in a rotary plate and the number of hall elements included in a hall sensor, as discussed further, above. The look-up table of the example of FIG. 11 shows an example based on using three hall elements and 30 degree sections, but a look-up table used in examples may be, for example, a look-up table based on 20 degree sections if the number of magnetic pieces of a rotary plate is eighteen, and the look-up table may be suitably modified if a different number of hall elements and/or sections having various numbers of degrees are used.

If the rotation angle detecting apparatus 100 uses the look-up table when detecting a magnetic value related to a rotation angle or a rotation angle related to a magnetic value, calculating time is decreased due to the presence of the pre-existing information, so a rotation angle detection speed in a rotation angle detecting apparatus may be increased accordingly. In addition, the amount of calculation is decreased and there is an effect of the decrease in heat generation properties of a signal processor of the rotation angle detecting apparatus.

Figure 12:
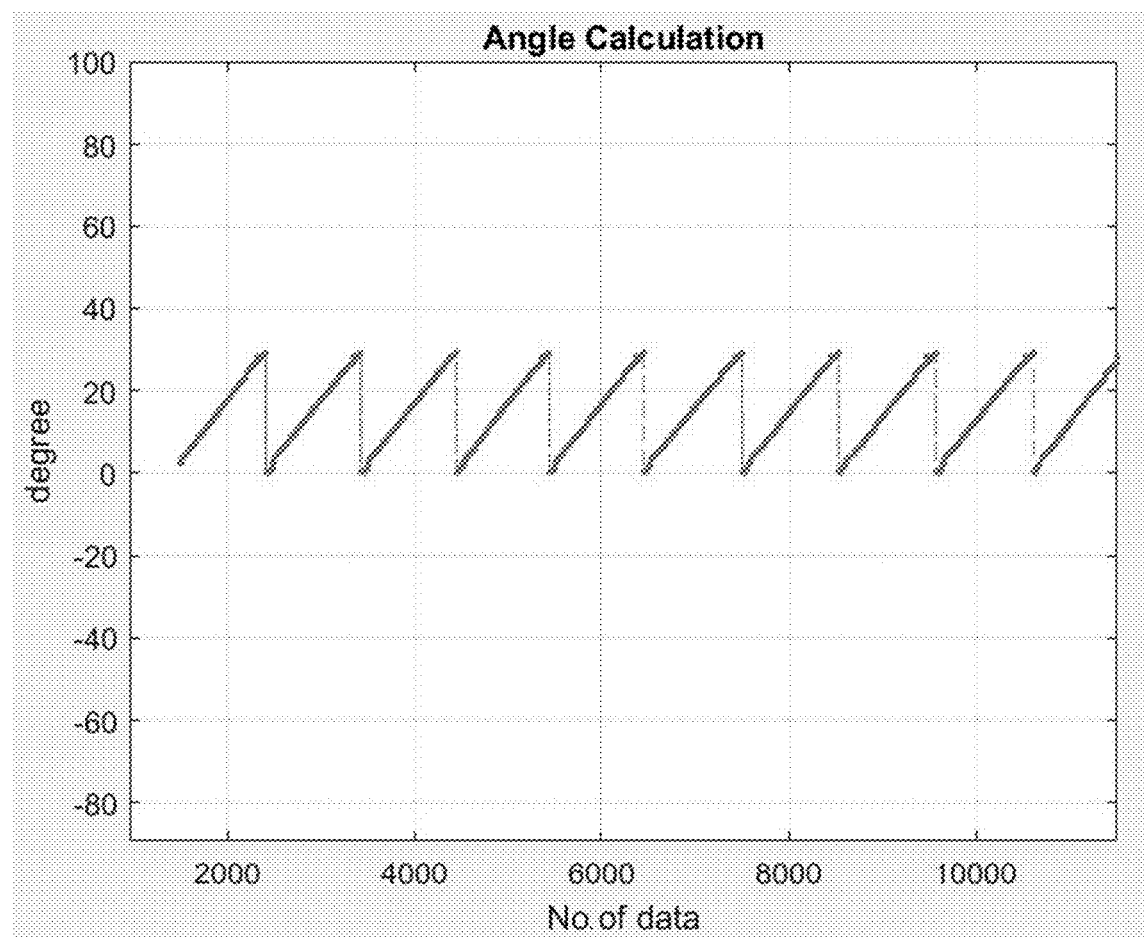
FIG. 12 is a graph of angle x of a rotation angle detecting apparatus.
Figure 13:
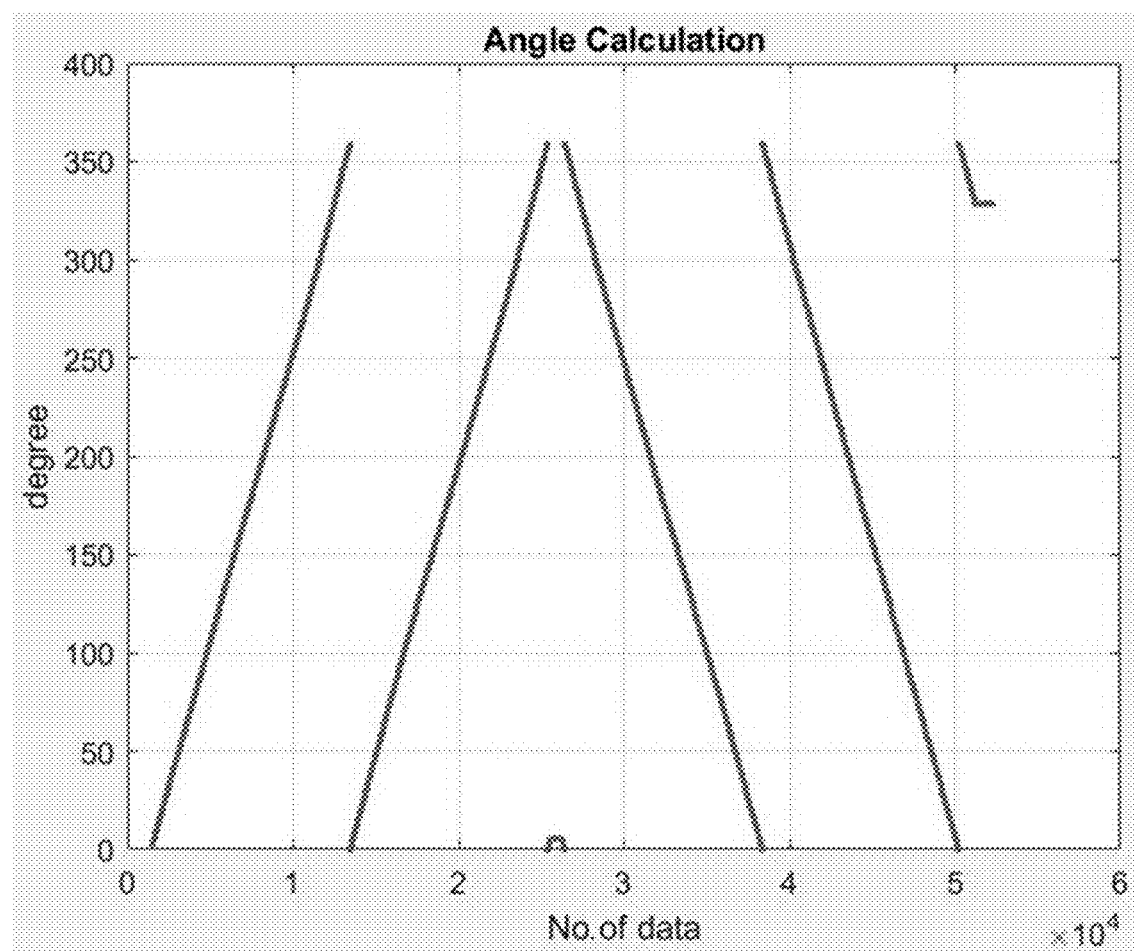
FIG. 13 is a graph showing that the angle x of the example of FIG. 12 is continuously changed by 360 degrees.

FIG. 12 is a graph of an angle x detected in a rotation angle detecting apparatus, and FIG. 13 is a graph showing that the angle x of the example of FIG. 12 is continuously changed over a total of 360 degrees.

Referring to the example of FIG. 12, a confirmed rotation angle x', outputted by a rotation angle detecting apparatus 100, increases from 0 degree to 30 degrees per section based on the number of magnetic pieces of a rotary plate, and it then repeats again for each second, starting at 0 degrees.

Referring to the example of FIG. 13, the confirmed rotation angle x' is rotated two times in the forward direction, that is, clockwise from 0 degree to 360 degrees, and then rotated two times in the opposite direction. That is, it is seen in the example of FIG. 13 that the confirmed rotation angle that is similar to an actual rotation angle by adjusting gain α applied to a rotation angle detecting function or a look-up table is accurately detected, in spite of a disturbance that may result from the manufacturing deviation of magnetic pieces or hall elements.

Figure 14:
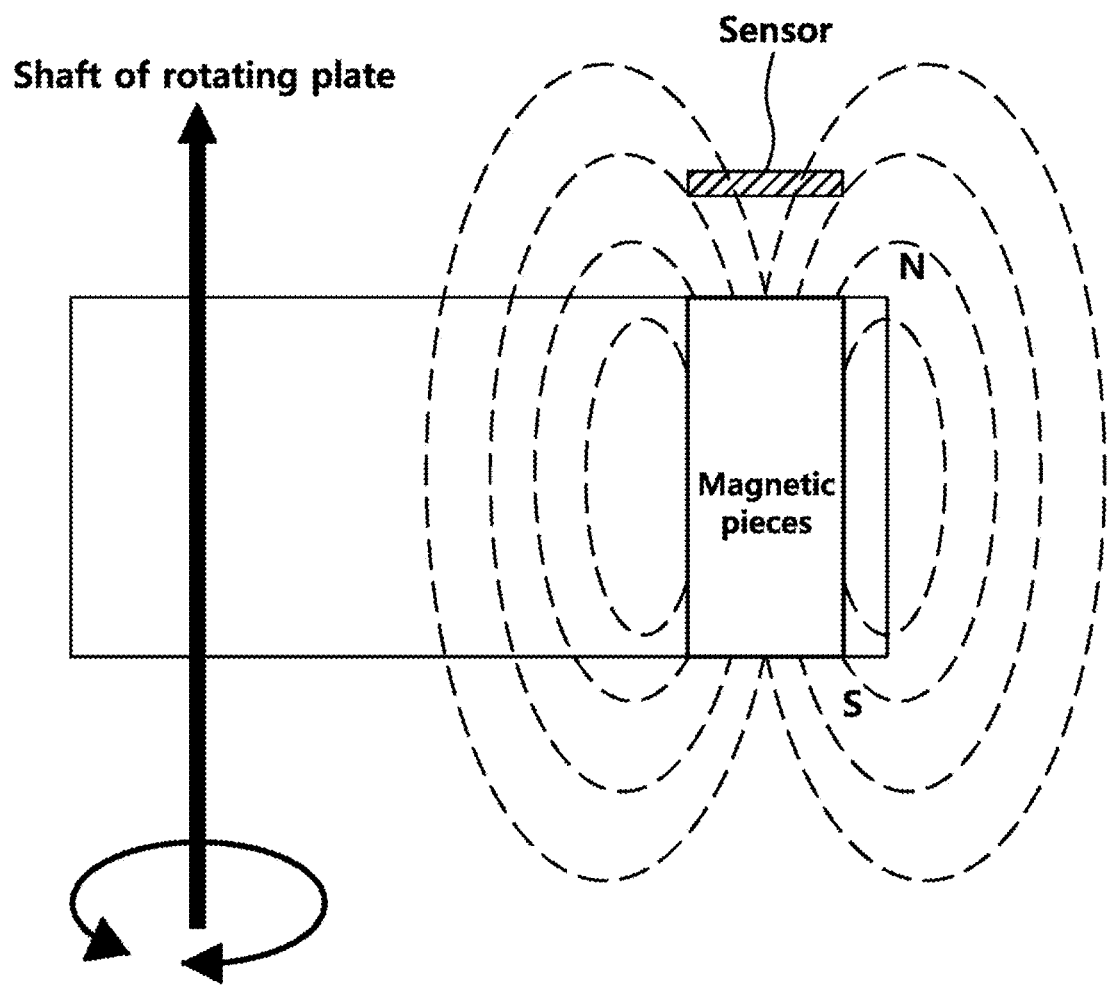
FIG. 14 is a drawing of an example of a rotation angle detecting apparatus.
Figure 15:
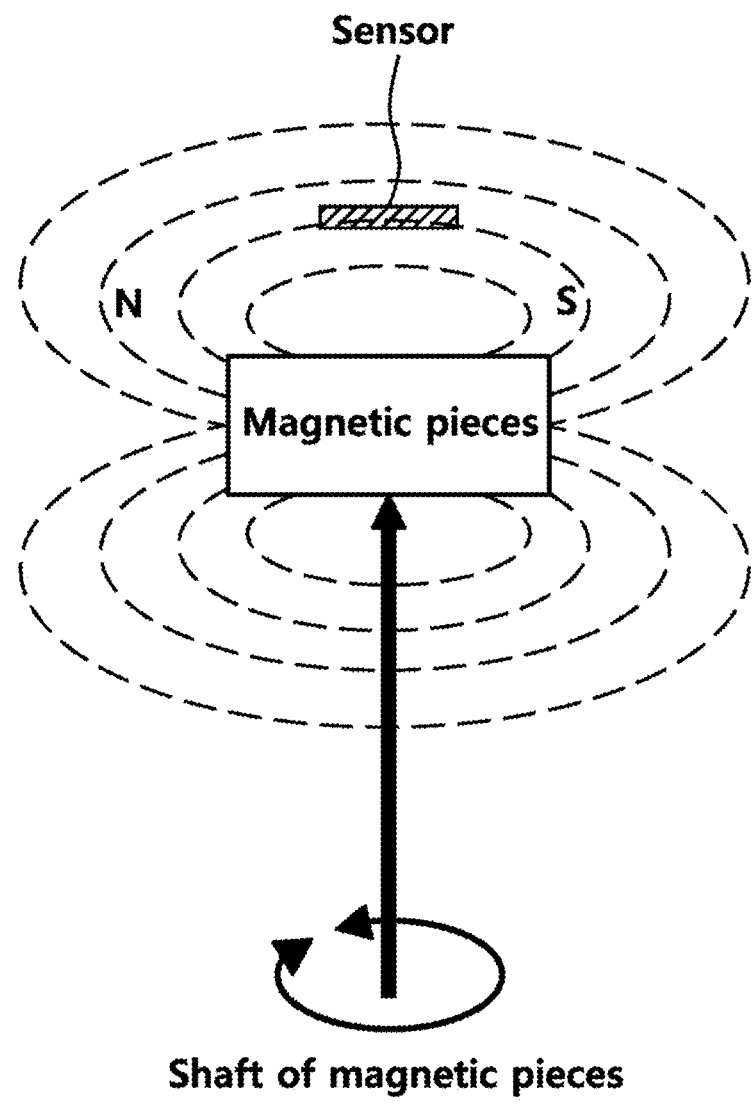
FIG. 15 is a drawing of another example of a rotation angle detecting apparatus.

FIG. 14 is a drawing of an example of a rotation angle detecting apparatus, and FIG. 15 is a drawing of another example of a rotation angle detecting apparatus.

In the rotation angle detecting apparatus, locations between magnetic pieces and sensors may be variously arranged according to the following description.

In an example, as illustrated in the example of FIG. 14, a plurality of magnetic pieces spaced apart at the same distance from a rotation axis are rotating in a same rotating plate, and hall sensors may be spaced apart at a certain distance on the rotating plate. In another embodiment, as illustrated in FIG. 15, a plurality of magnetic pieces themselves rotate on an ordinate axis, and a hall sensor may be disposed spaced apart at a certain distance on the rotating plate of magnetic pieces.

The rotation angle detecting apparatus 100, base member 110, rotary body 120, rotation axis 122, magnetic pieces 130, hall sensors 140, circuit board 200, signal pre-processor 210, AD converter, amplifier 212, filter 213, signal processor 220, calculator 221, gain adjuster 222, outputter 230, and storage 240 in FIGS. 1-2 and 4 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

The present disclosure has been provided above with the object of method steps illustrating the performance of certain functions and their relationships. The boundaries and sequences of these functional components and method steps have been arbitrarily defined herein for convenience of explanation. Alternative boundaries and sequences may be defined as long as the specific functions and relationships are properly performed. Any such alternative boundaries and sequences are therefore within the scope and spirit of the claimed disclosure above. In addition, the boundaries of these functional components have been arbitrarily defined for ease of description. Alternative boundaries can be defined as long as certain important functions are performed properly. Similarly, flowchart blocks may also be arbitrarily defined herein to denote any significant functionality. For extended use, the boundaries and sequence of the flowchart blocks may have been defined and still perform some important functions. Therefore, alternative definitions of both functional components and flowchart blocks and sequences are within the scope and spirit of the present disclosure claimed.

The present disclosure may be described, at least in part, in the language of one or more examples. Examples of the disclosure are used herein to describe the disclosure aspects thereof, features thereof, concepts thereof, and/or examples thereof. The physical examples of an apparatus, article of manufacture, machine, and/or process for implementing the disclosure may include one or more aspects, features, concepts, examples, and so on, described with reference to one or more examples described herein. Furthermore, in the entire drawings, examples may incorporate the same or similarly named functions, steps, modules, and so on, that may use the same or different reference numerals, and so on; also, steps, modules, and so on may be the same or similar functions, steps, modules, and so on, or different things.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A rotation angle detecting method of a rotation angle detecting apparatus comprising hall elements and magnetic pieces, the method comprising:
   detecting a first rotation angle based on a first measured magnetic value received from a first hall element;
   detecting a first magnetic value received from a second hall element corresponding to the first detected rotation angle;
   adjusting a gain based on a first difference value between a second measured magnetic value received from the second hall element, in response to one of the magnetic pieces being rotated at the first rotation angle, and the first magnetic value;
   redetecting a second rotation angle by applying the gain to the first magnetic value and redetecting a second magnetic value received from the second hall element, corresponding to the second rotation angle; and
   outputting the second rotation angle as a confirmed rotation angle in response to a second difference value between the second magnetic value and the second measured magnetic value becoming less than a delta value.

2. The rotation angle detecting method of claim 1, wherein the first and second hall elements are hall elements having magnetic values with most sensitive output waveform changes from respective output waveform changes of the hall elements.

3. The rotation angle detecting method of claim 1, wherein adjusting the gain comprises increasing the gain by an adjustment value in response to the second difference value being greater than the first difference value.

4. The rotation angle detecting method of claim 1, wherein adjusting the gain comprises decreasing the gain by an adjustment value in response to the second difference value being less than the first difference value.

5. The rotation angle detecting method of claim 1, wherein adjusting the gain further comprises changing the gain by an adjustment value, wherein the adjustment value differs depending on a result of a comparison between the first difference value and the second difference value.

6. The rotation angle detecting method of claim 1, wherein at least two hall elements are disposed such that relative motion directions and phases of the magnetic pieces coincide with a relative motion direction and a phase of a hall sensor comprising the at least two hall elements.

7. The rotation angle detecting method of claim 1, wherein the detected magnetic value is a magnetic value calculated using a function based on rotation angles of each of the hall elements.

8. The rotation angle detecting method of claim 1, wherein the detected magnetic values are magnetic values corresponding to rotation angles of each of the hall elements and stored in a look-up table.

9. The rotation angle detecting method of claim 1, wherein the magnetic pieces are spaced evenly at intervals along a circumference of a rotary body.

10. A rotation angle detecting apparatus comprising:
    magnetic pieces located in a rotary body;
    a hall sensor comprising at least three hall elements configured to measure magnetic values of each of the magnetic pieces; and
    a signal processor configured to
    adjust a gain by applying a first measured magnetic value received from a first hall element to a second hall element and detecting a confirmed rotation angle, by
        calculating a first magnetic value by applying a first rotation angle detected based on the first measured magnetic value to a second hall element,
        adjusting a gain based on a first difference value between the first magnetic value and a second measured magnetic value received from the second hall element, in response to one of the magnet pieces being rotated at the first rotation angle, and the first detected magnetic value, and
        outputting the second rotation angle as the confirmed rotation angle based on a comparison result of a second difference value between a second magnetic value redetected based on the gain and the second measured magnetic value with the first difference value.

11. The rotation angle detecting apparatus of claim 10, wherein the signal processor is configured to select two output waveforms in descending order of absolute values of differential values of output waveforms, out of the hall elements.

12. The rotation angle detecting apparatus of claim 10, wherein the signal processor is configured to adjust the gain by increasing the gain by an adjustment value in response to the second difference value being greater than the first difference value and by decreasing the gain by the adjustment value in response to the second difference value being less than the first difference value.

13. The rotation angle detecting apparatus of claim 10, wherein the rotation angle detecting apparatus further comprises storage for storing magnetic values corresponding to each of the rotation angles of the hall elements in a look-up table.

14. The rotation angle detecting apparatus of claim 10, wherein the signal processor is configured to adjust the gain until the second difference value is less than a delta value and then redetect the second detecting rotation angle.

15. The rotation angle detecting apparatus of claim 10, wherein the magnetic pieces are spaced evenly at intervals along a circumference of the rotary body.

16. The rotation angle detecting apparatus of claim 10, wherein adjusting the gain further comprises changing the gain by an adjustment value, wherein the adjustment value differs depending on a result of a comparison between the first difference value and the second difference value.

* * * * *